(12) United States Patent
Rode et al.

(10) Patent No.: US 8,956,897 B2
(45) Date of Patent: Feb. 17, 2015

(54) METHOD FOR PRODUCING AN OPTOELECTRONIC COMPONENT AND OPTOELECTRONIC COMPONENT

(75) Inventors: Patrick Rode, Regensburg (DE); Martin Strassburg, Tegernheim (DE); Karl Engl, Niedergebraching (DE); Lutz Höppel, Alteglofsheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 286 days.

(21) Appl. No.: 13/598,896

(22) Filed: Aug. 30, 2012

(65) Prior Publication Data

US 2012/0322186 A1  Dec. 20, 2012

Related U.S. Application Data

(63) Continuation of application No. 12/990,243, filed as application No. PCT/DE2009/000810 on Jun. 9, 2009, now Pat. No. 8,283,191.

(30) Foreign Application Priority Data

Jun. 27, 2008 (DE) .......................... 10 2008 030 584

(51) Int. Cl.
*H01L 21/00* (2006.01)
*H01L 21/66* (2006.01)
(Continued)

(52) U.S. Cl.
CPC .............. *H01L 33/382* (2013.01); *H01L 33/22* (2013.01); *H01L 33/14* (2013.01); *H01L 33/007* (2013.01); *H01L 33/0079* (2013.01); *H01L 33/62* (2013.01); *H01L 2224/48* (2013.01)
USPC ................................. 438/29; 438/16; 438/30

(58) Field of Classification Search
USPC .................................................. 438/16, 29, 30
See application file for complete search history.

(56) References Cited

U.S. PATENT DOCUMENTS 5,763,941 A * 6/1998 Fjelstad ...................... 257/669
6,111,272 A   8/2000 Heinen
(Continued)

FOREIGN PATENT DOCUMENTS

DE   10020464   11/2001
DE   10147886   4/2003
(Continued)

OTHER PUBLICATIONS

Schnitzer, I. et al. "30% external quantum efficiency from surface textured, thin-film light-emitting diodes" *Appl. Phys. Lett.* 63 (16) (Oct. 18, 1993) pp. 2174-2176.
(Continued)

*Primary Examiner* — Khiem D Nguyen
*Assistant Examiner* — Wilner Jean Baptiste
(74) *Attorney, Agent, or Firm* — Occhiuti & Rohlicek LLP

(57) ABSTRACT

In a method for producing an optoelectronic component, a growth substrate having a first coefficient of thermal expansion is provided. A multilayered buffer layer sequence is applied thereto. A layer sequence having a second coefficient of thermal expansion—different than the first coefficient of thermal expansion—is subsequently deposited epitaxially. It furthermore comprises an active layer for emitting electromagnetic radiation. A carrier substrate is subsequently applied on the epitaxially deposited layer sequence. The growth substrate is removed and the multilayered buffer layer sequence is structured in order to increase a coupling-out of electromagnetic radiation. Finally, contact is made with the epitaxially deposited layer sequence.

17 Claims, 5 Drawing Sheets

Figure 3:
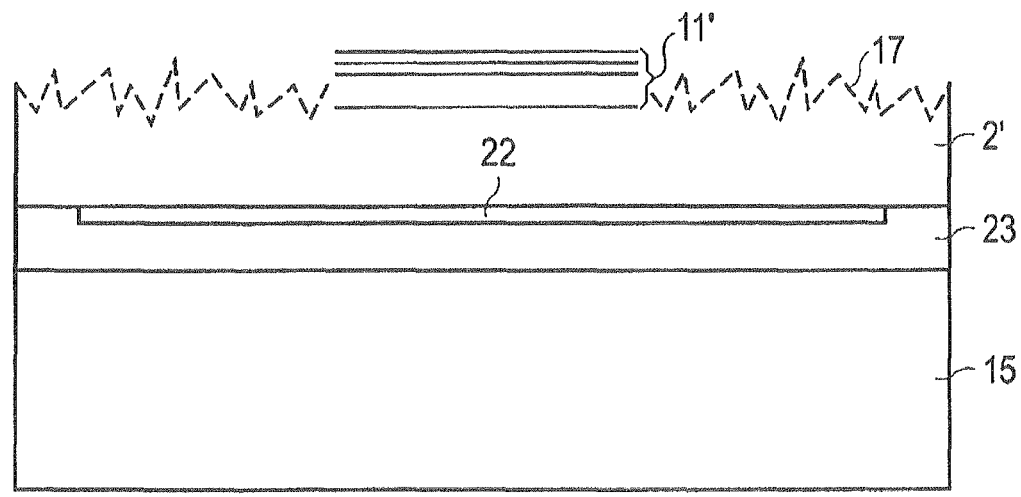

(51) Int. Cl.
  *H01L 33/38* (2010.01)
  *H01L 33/22* (2010.01)
  *H01L 33/14* (2010.01)
  *H01L 33/00* (2010.01)
  *H01L 33/62* (2010.01)

(56) References Cited

U.S. PATENT DOCUMENTS

| | | | |
|---|---|---|---|
| 6,121,638 | A | 9/2000 | Rennie et al. |
| 6,878,563 | B2 | 4/2005 | Bader et al. |
| 7,413,918 | B2 | 8/2008 | Tran et al. |
| 7,709,851 | B2 | 5/2010 | Bader et al. |
| 2002/0115356 | A1* | 8/2002 | Baker et al. ............ 439/886 |
| 2006/0068601 | A1 | 3/2006 | Lee et al. |
| 2006/0124956 | A1 | 6/2006 | Peng |
| 2007/0187738 | A1 | 8/2007 | Graettinger |
| 2007/0197004 | A1 | 8/2007 | Dadgar et al. |
| 2008/0054247 | A1 | 3/2008 | Eichler et al. |
| 2008/0073655 | A1 | 3/2008 | Albrecht et al. |
| 2008/0080581 | A1 | 4/2008 | Wierer et al. |
| 2009/0065800 | A1 | 3/2009 | Wirth et al. |

FOREIGN PATENT DOCUMENTS

| | | |
|---|---|---|
| DE | 102005007601 | 9/2005 |
| DE | 10200516592 | 11/2005 |
| DE | 102006008929 | 8/2007 |
| DE | 102006046237 | 1/2008 |
| EP | 0905797 | 3/1999 |
| EP | 1577958 | 9/2005 |
| EP | 1885001 | 5/2008 |
| JP | 2004047988 | 2/2004 |
| JP | 2005317959 | 11/2005 |
| JP | 2006100501 | 4/2006 |
| WO | 02/13281 | 2/2002 |
| WO | 2004/051707 | 6/2004 |

OTHER PUBLICATIONS

Cheng, Kai, et al. "High Quality GaN grown on silicon(111) using a $Si_xN_y$ interlayer by mental-organic vapor phase epitaxy" Applied Physics Letters, *American Institute of Physics*, vol. 92, No. 19 (May 2008) pp. 192111-1 to 192111-3.

Schulze, F. et al. "Metalorganic vapor phase epitaxy grown InGaN/GaN light-emitting diodes on Si(001) substrate" Applied Physics Letters, *American Institute of Physics*, vol. 88, No. 12 (Mar. 2006) pp. 121114-1 to 121114-3.

* cited by examiner

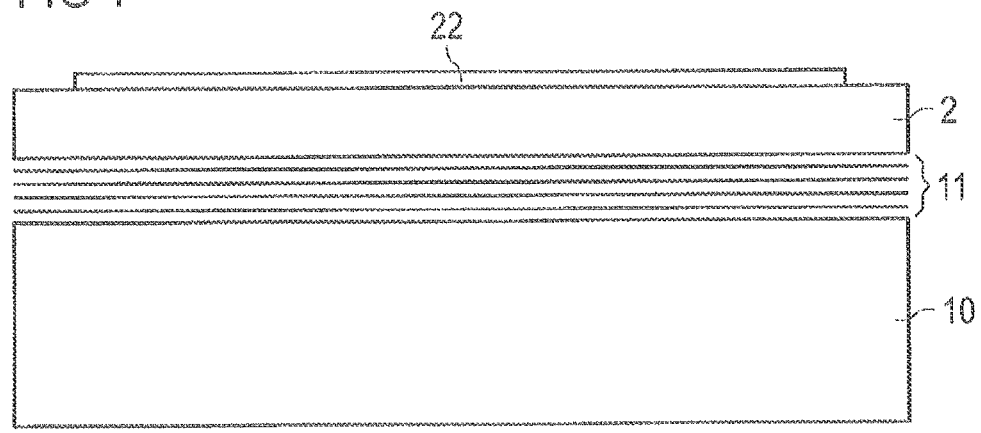
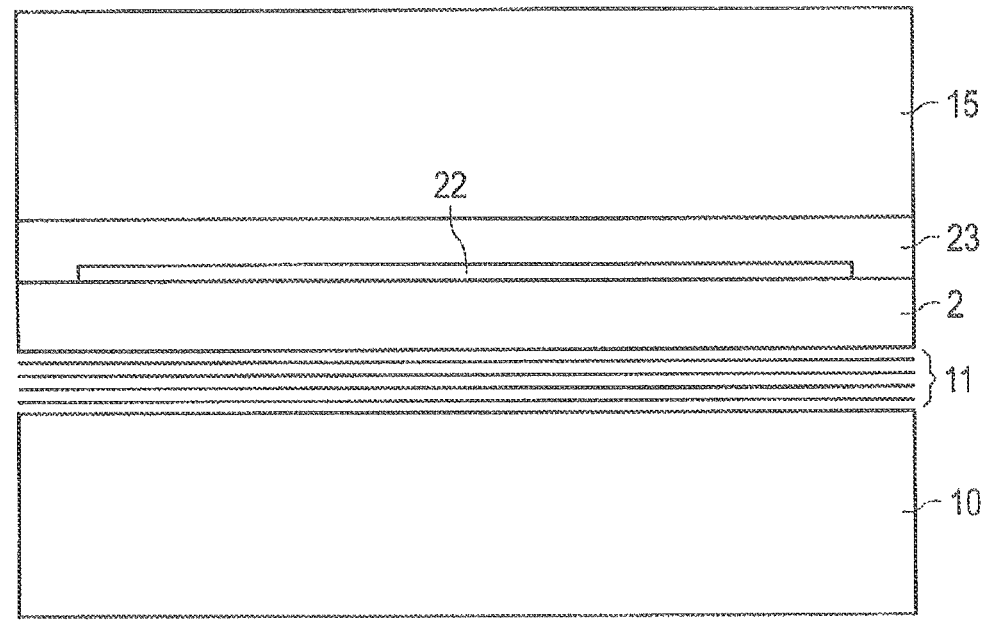

METHOD FOR PRODUCING AN OPTOELECTRONIC COMPONENT AND OPTOELECTRONIC COMPONENT

CROSS-REFERENCE TO RELATED APPLICATIONS

This application a continuation of U.S. application Ser. No. 12/990,243, filed Oct. 29, 2010, which is the National Stage of International Application No. PCT/DE2009/000810, filed on Jun. 9, 2009, which claims the priority of German Patent Application No. 10 2008 030 584.7, filed on Jun. 27, 2008. The contents of both applications are hereby incorporated by reference in their entirety.

This patent application claims the priority of German patent application 102008030584.7, the disclosure content of which is hereby incorporated by reference.

The invention relates to a method for producing an optoelectronic component, and to an optoelectronic component.

Optoelectronic components, often also referred to by the simplified designation light-emitting diodes or light-emitting diode chips, have an increasing number of different application possibilities, which have recently caused demand for such components to increase. Thus, light-emitting diodes are increasingly being used, inter alia, as luminous means in the automotive field, but also in industrial and domestic applications. Consequently, alongside the technical properties such as, for example, a low current consumption or a long lifetime, production in large numbers that is as cost-effective as possible is also of importance.

Hitherto, the production of high-efficiency optoelectronic components, in particular of light-emitting diodes, which emit in the green and/or blue spectrum of visible light has been associated with a high production outlay. By way of example, for the production of optoelectronic components based on gallium nitride/indium gallium nitride, a growth substrate composed of sapphire is used, which, in subsequent process steps, is detached again for example by means of a laser lift-off process. Alongside the low scalability of such a growth substrate, the further process steps can also produce stresses within the optoelectronic component which can reduce the efficiency of the component but also the production yield. Therefore, there is a need to specify a method which makes it possible to produce optoelectronic components in large numbers with good scalability and low technological requirements. Moreover, a component of this type should achieve an efficient coupling-out of light in conjunction with good electrical characteristic data.

These objects are achieved by means of the subjects of the independent patent claims. The dependent claims relate to developments and configurations of the invention.

The invention presents a solution approach which enables the silicon production technology known from other areas to be employed for the production of optoelectronic high-efficiency components. This method involves providing a growth substrate, which contains silicon or even consists thereof in one embodiment. Silicon-containing material as growth substrate has a first coefficient of thermal expansion. A multilayered buffer layer sequence is subsequently applied to the growth substrate. A layer sequence having a second coefficient of thermal expansion, which is different than the first coefficient of thermal expansion, is subsequently deposited epitaxially on the multilayered buffer layer sequence. The layer sequence additionally comprises an active layer suitable for emitting electromagnetic radiation.

The multilayered buffer layer sequence reduces stresses in the layer sequence on account of different thermal expansions of the growth substrate and of the layer sequence. The multilayered buffer layer sequence thus acts as a buffer layer for compensating for the different thermal expansions. Afterward, a carrier substrate is applied on the epitaxially grown layer sequence and the growth substrate is removed. In this case, however, only the growth substrate is detached, while the multilayered buffer layer sequence remains on the epitaxially deposited layer sequence. This is then structured in order to increase a coupling-out of electromagnetic radiation generated during operation from the epitaxially deposited layer sequence. Finally, electrical contact is made with the layer sequence on the rear side and bonding contacts are formed.

In the case of the invention, therefore, the multilayered buffer layer sequence is used for coupling out light. By contrast, contact is made with the epitaxially deposited layer sequence through the buffer structure or on a side of the epitaxially deposited layer sequence which is remote from the multilayered buffer layer sequence. In the case of the latter concept, the poorly conductive multilayered buffer layer sequence does not have to be severed. Rather, contact can be made directly with the epitaxially deposited layer sequence via contact holes or leads. This enables firstly a low forward voltage of the optoelectronic component with at the same time efficient coupling-out of light and good current spreading if appropriate through partial layers of the epitaxially deposited layer sequence.

Thin-film technology can be used for the production of the layer sequence.

In this context, the term thin-film technology denotes a technology for producing a thin-film light-emitting diode chip. A thin-film light-emitting diode chip is distinguished by at least one of the following characteristic features:

a reflective layer is applied or formed at a main area—facing toward a carrier element, in particular the carrier substrate—of the radiation-generating semiconductor layer sequence, which is a radiation-generating epitaxial layer sequence, in particular, said reflective layer reflecting at least part of the electromagnetic radiation generated in the semiconductor layer sequence back into the latter;

the thin-film light-emitting diode chip has a carrier element, which is not the growth substrate on which the semiconductor layer sequence was grown epitaxially, but rather a separate carrier element subsequently fixed to the semiconductor layer sequence;

the semiconductor layer sequence has a thickness in the range of 20 µm or less, in particular in the range of 10 µm or less;

the semiconductor layer sequence is free of a growth substrate. In the present case, "free of a growth substrate" means that any growth substrate possibly used for growth purposes is removed from the semiconductor layer sequence or at least greatly thinned. In particular, it is thinned in such a way that it is not self-supporting by itself or together with the epitaxial layer sequence alone; and the semiconductor layer sequence contains at least one semiconductor layer with at least one area having an intermixing structure which ideally leads to an approximately ergodic distribution of the light in the semiconductor layer sequence, that is to say that it has an as far as possible ergodically stochastic scattering behavior.

A basic principle of a thin-film light-emitting diode chip is described for example in the document I. Schnitzer et al., Appl. Phys. Lett. 63 (16), Oct. 18, 1993, pages 2174-2176, the disclosure content of which in this respect is hereby incorporated by reference. Examples of thin-film light-emitting diode chips are described in the documents EP 0905797 A2 and WO 02/13281 A1, the disclosure content of which in this respect is hereby likewise incorporated by reference. A thin-film light-emitting diode chip is to a good approximation a Lambertian surface emitter and is therefore well suited, for example, to application in a headlight, for instance a motor vehicle headlight.

In one exemplary embodiment, the material of the epitaxially deposited layer sequence is based on a nitride compound semiconductor.

In general, a material of the epitaxially deposited layer sequences has a coefficient of thermal expansion which is distinctly different than the coefficient of thermal expansion of the silicon-containing growth substrate. In the case of direct deposition of the layer sequence on the silicon-containing growth substrate, thermal stresses occur on account of the high temperature gradients during the production process, which thermal stresses can lead to damage and, in the worst case, to breaking of the thin epitaxially deposited layer sequence.

For this reason, according to the invention, a multilayered buffer layer sequence is applied between the growth substrate and the epitaxially deposited layer sequence. Preferably, said multilayered buffer layer sequence comprises partial layers composed of gallium nitride and aluminum nitride. This serves to reduce the thermal strains induced by the production process on account of the different coefficients of expansion.

For this purpose, in one exemplary embodiment, the buffer layer sequence can comprise a first partial buffer layer and at least one second partial buffer layer. It expediently contains a multiplicity of first and second partial buffer layers arranged one above another with the formation of a multilayer layer sequence. In this case, the materials of the partial buffer layers can likewise have different coefficients of thermal expansion. Furthermore, provision can be made for using a material of a first partial buffer layer which is slightly strained during application to the second partial buffer layer.

Given a suitable choice of the materials it is thus possible to prevent a thermal strain in the epitaxially deposited layer sequence since the partial buffer layers serve as dampers, or sacrificial layers for such strains. Any strain occurring in the epitaxial layer sequence continues in the already slightly strained partial buffer layer. The partial buffer layer can tear or break there, as a result of which the strain is reduced without the epitaxial layer sequence being significantly altered structurally.

It may be expedient for at least one of the two partial buffer layers to be embodied with a material which is also used for the fabrication of the epitaxially deposited layer sequence. In the case of a use of a III-V semiconductor for example on the basis of nitride, a nitride-based compound semiconductor, for example gallium nitride, can likewise be used as material of the multilayered buffer layer sequence in one partial buffer layer. Aluminum nitride, for example, is suitable as material of the second partial buffer layer.

Furthermore, the multilayered buffer layer sequence has the advantage that different technologies can now be used for removing the growth substrate. By way of example, the growth substrate can be etched away for removal, wherein the multilayered buffer layer sequence can serve as an etching stop layer. This results in significantly gentler removal of the growth substrate compared with the mechanical removal method of technologies conventionally based on sapphire or silicon carbide. In one embodiment, the growth substrate based on silicon is removed by means of wet-chemical etching.

The structuring of the multilayered buffer layer sequence can likewise be effected by etching. In this case, it is possible to provide the buffer layer sequence with well-defined structures. Alternatively, it is also possible to carry out random structuring for example by roughening with a thickness of 0 µm to 3 µm (typically 1 µm to 2 µm). Given a thickness of the multilayered buffer layer sequence of 1 µm to 5 µm (typically 2 µm to 4 µm) it is conceivable, moreover, to completely remove the buffer layer sequence in partial regions and, moreover, to structure the underlying epitaxially grown layer sequence in said partial regions.

In one exemplary embodiment, before the carrier substrate is applied, a mirror layer is deposited on the epitaxially grown layer sequence. The mirror layer can comprise for example a specularly reflective metal such as silver, but also aluminum or other highly reflective materials. In a further configuration, the mirror layer is encapsulated after deposition on the epitaxially grown layer sequence, that is to say surrounded with an insulating material. The latter prevents premature ageing of the mirror layer, for example as a result of oxidation.

For making contact with the epitaxially grown layer sequence, in particular the two differently doped partial layers of the epitaxially grown layer sequence for supplying the respective charge carriers, provision can be made for completely removing the multilayered buffer layer in a partial region. The underlying epitaxially grown layer sequence is uncovered as a result. Afterward, in the partial region in which the multilayered buffer layer has been removed, a contact is formed which makes electrical contact with the grown layer sequence. Consequently, contact is not made via the multilayered buffer layer, but rather directly with the layer sequence as a result of corresponding structuring of the multilayered buffer layer.

This is expedient particularly when the multilayered buffer layer has a significantly poorer conductivity, such that making contact with the buffer layer would lead to an increase in the forward voltage of the component and hence a reduction in efficiency. Accordingly, a connection to the epitaxially grown layer sequence is thus achieved for example by means of targeted etching through the buffer layer. Such an etching process can comprise, for example, an RIE (Reactive Ion Etching), ICP, but also the chemical etching method for example using phosphoric acid ($H_3PO_4$). The poorly conductive multilayered buffer layer is thus severed and a contact is formed directly on a highly conductive current spreading layer of the epitaxially grown layer sequence. However, chemical removal is difficult since the various partial layers of the buffer layer sequence are very thin and the etching process is accordingly complex. The epitaxial layer sequence is as well, as a result of which the overall etching process is difficult to control since the etching operation should stop as exactly as possible at the current spreading layer, or the first layer adjacent to the buffer layer sequence.

In an alternative embodiment, the contacts are introduced on the rear side. The invention thus proposes separating the coupling-out function of the layers for generated light from a current coupling-in layer. For this purpose it is proposed to form a hole having an opening on that side of the epitaxially grown layer sequence which is remote from the multilayered buffer layer. An insulation layer on sidewalls of the hole prevents an undesired short circuit. The hole is subsequently filled with a conductive material, such that an electrical contact of the epitaxially grown layer sequence is produced at least in a bottom region of the hole. In this case, it is expedient if the hole passes through partial layers and, in particular, the active layer of the epitaxially grown layer sequence. Accordingly, with holes of this type, contact can be made with any partial layer of the epitaxially grown layer sequence if the hole ends in the layer with which contact is to be made and the sidewalls of the hole are provided with an insulation material for preventing short circuits. Finally, a bonding contact is formed, which is connected to the conductive material of the hole.

In this case, provision can be made for forming the holes, the conductive material and also the leads to the bonding wires and the bonding contacts on the epitaxially grown layer sequence before the latter is removed from the growth substrate and applied on the carrier substrate.

In a further configurational form, a through-hole is produced through the carrier substrate, wherein the sidewalls of the through-hole are provided with an insulating material. The hole in the carrier substrate is formed in such a way that it exposes conductive layers between the epitaxially grown layer sequence and the carrier substrate. The hole is subsequently filled with an electrically conductive material. As a result, it is possible to make contact with electrically conductive layers between the epitaxially grown layer sequence and the carrier substrate. These layers in turn serve for making contact with the individual partial layers of the epitaxially grown layer sequence.

The method is particularly suitable if the growth substrate comprises a semiconductor material, in particular silicon. Silicon precisely is a readily scalable technology, such that optoelectronic components can also be produced in large numbers. On account of the coefficients of thermal expansion of silicon and of the layer sequence of the optoelectronic component for light emission, the additional application of a multilayered buffer layer sequence between the epitaxially grown layer sequence and the carrier substrate comprising silicon is expedient in order to avoid thermal strains. By comparison, however, a growth substrate composed of silicon can be removed particularly simply by wet-chemical methods, such that a mechanical loading of the optoelectronic component is reduced here.

Another aspect of the invention relates to an optoelectronic component comprising an epitaxially grown layer sequence having an active layer suitable for emitting electro magnetic radiation. In this case, provision is made for emitting electromagnetic radiation in the direction of a first surface of the epitaxially grown layer sequence during operation. The optoelectronic component furthermore comprises a multilayered structured buffer layer sequence on the surface of the epitaxially grown layer sequence. Said multilayered buffer layer sequence serves for increasing the light coupling-out efficiency during operation of the component. Furthermore, contact elements are provided, which can be arranged on a side of the component which is remote from the light emission. As an alternative thereto, the multilayered buffer layer sequence is removed in partial regions and a contact pad is arranged there, said contact pad making contact directly with the epitaxially grown layer sequence or current spreading layers of the epitaxially grown layer sequence.

One difference with respect to previous optoelectronic components is that the multilayered buffer layer sequence for coupling out light has already been produced before the production of the epitaxially deposited layer sequence.

One embodiment provides for the multilayered buffer layer sequence to comprise the same material as a partial layer of the epitaxially grown layer sequence. As a result, during the production process, it is possible to reduce a thermal strain caused by the production process within the epitaxially grown layer sequence.

The invention is explained in detail below on the basis of exemplary embodiments with reference to the drawings.

Figure 4:
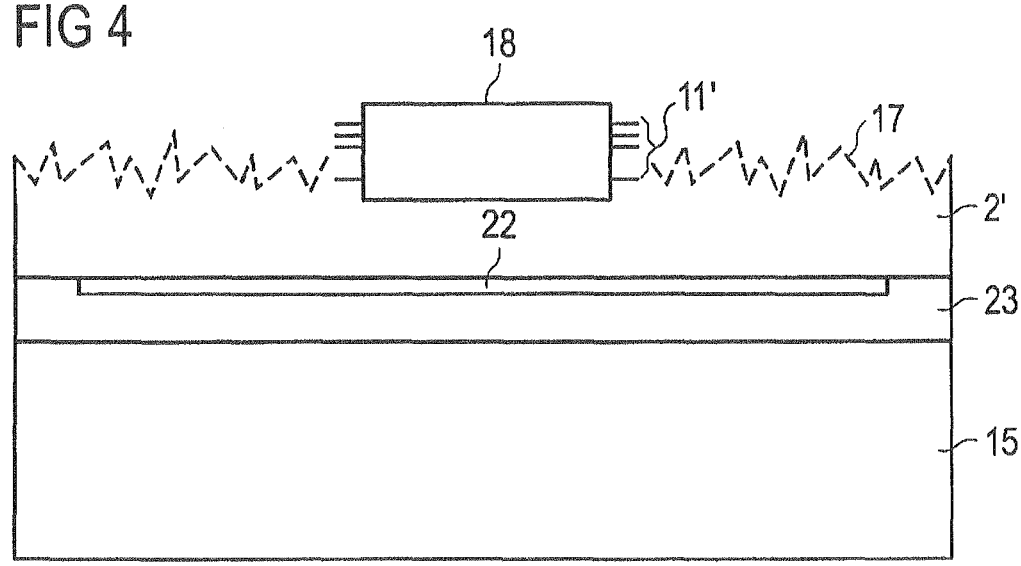
Figure 5:
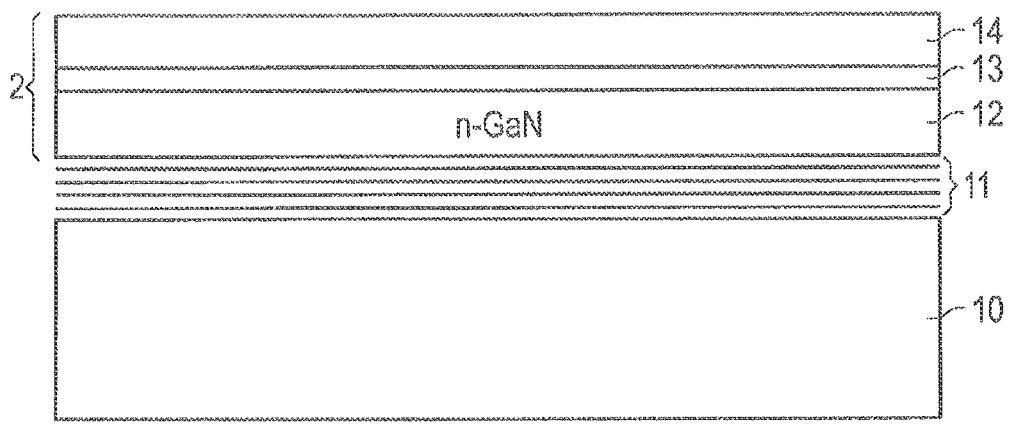
Figure 6:
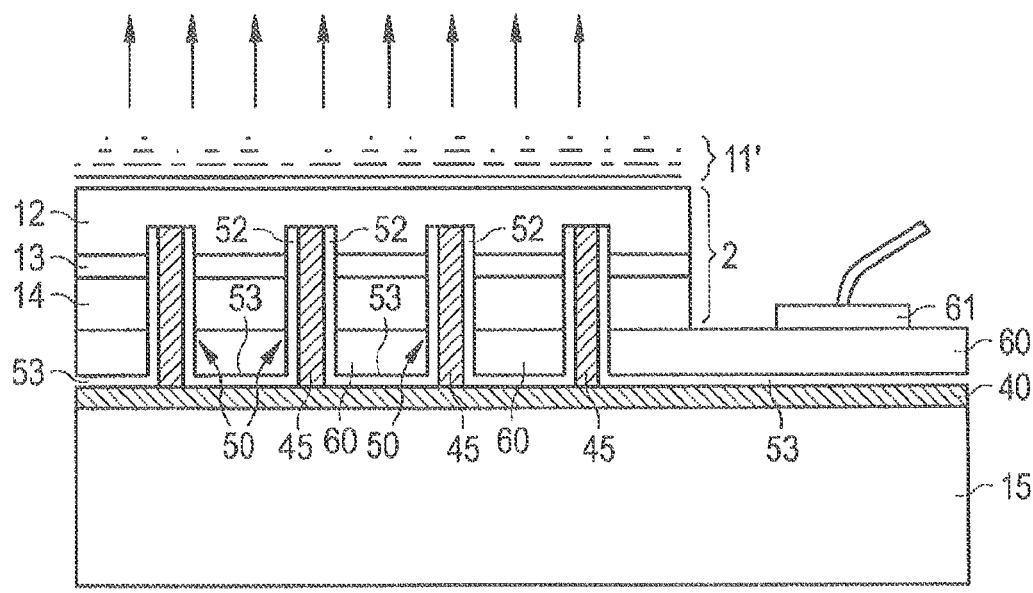
Figure 7:
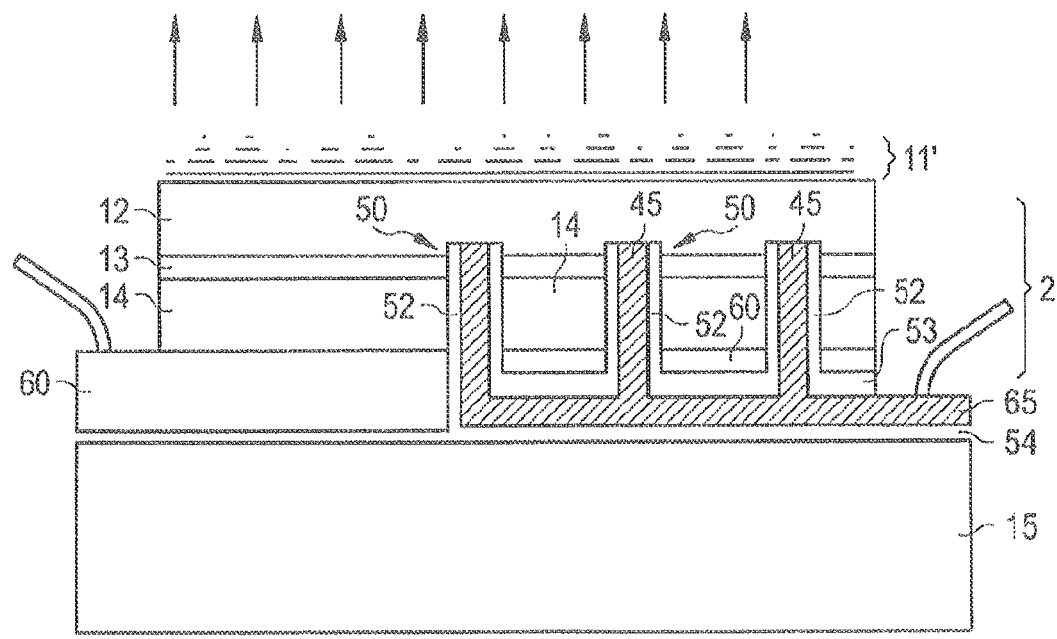
Figure 8:
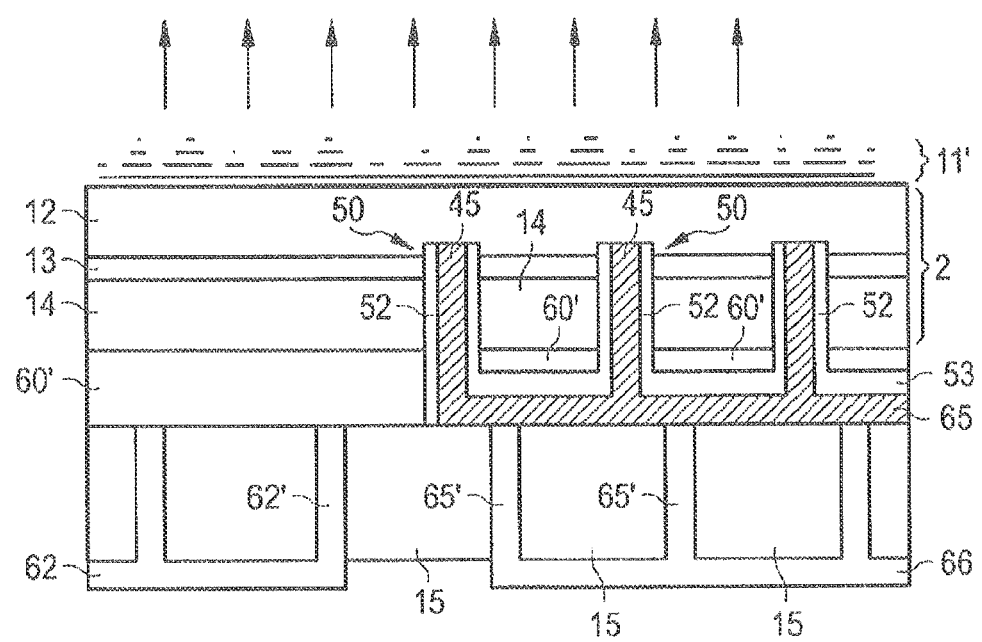
Figure 9:
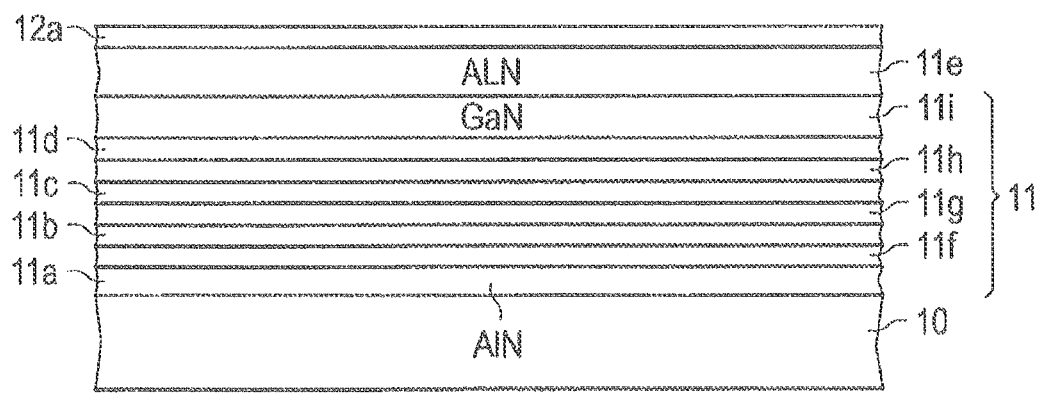

In the figures:

FIG. 1 shows an exemplary embodiment of an epitaxially grown layer sequence on a growth substrate during the production process, FIG. 2 shows a further step of the production process for an optoelectronic component, FIG. 3 shows a third step of the production process for an optoelectronic component after the removal of the growth substrate, FIG. 4 shows a fourth step of the production process for the optoelectronic component with a contact on the surface of the component, FIG. 5 shows a second embodiment of a method for producing an optoelectronic component, FIG. 6 shows a first embodiment of an optoelectronic component produced according to the production method proposed, FIG. 7 shows a second embodiment of an optoelectronic component according to the production method proposed, FIG. 8 shows a third embodiment of an optoelectronic component according to the production method proposed, FIG. 9 shows an excerpt from an optoelectronic component during the production process for elucidating the multilayered buffer structure.

In the exemplary embodiments and figures, identical or identically acting constituent parts are provided with the same reference symbols. In principle, the figures and the size relationships of the elements illustrated in the figures should not be regarded as true to scale. Rather, individual elements, for instance layers, may be illustrated with an exaggerated size or thickness in order to afford a better understanding and/or for the sake of better depictability. Individual aspects of the different embodiments can readily be combined among one another and interchanged in the context of the technology used.

FIG. 1 shows an optoelectronic component during the production process according to the principle proposed. In this embodiment, a wafer composed of silicon is provided as the growth substrate 10. By contrast, the optoelectronic component is intended to be fabricated from a III-V compound semiconductor. The latter has a different coefficient of thermal expansion than silicon. In the production method used by means of MOVPE ("Metal Organic Vapor Phase Epitaxy"), temperatures in the range of several 100 degrees Celsius, up to approximately 700° C.-800° C., are used. As a result, large temperature gradients can occur during the production process. In addition, there are further production methods, for example MBE or HVPE, which operate with temperatures at 1100° C.

By way of example, the growth substrate 10 composed of silicon can, on account of its larger mass, be significantly cooler than the layers deposited thereon. For this reason, direct epitaxial deposition of a layer sequence for emitting electromagnetic radiation onto silicon is associated with major difficulties since the different coefficients of thermal expansion can lead to strains in the layer sequence deposited. Said strains become so great that layers break or tear and the component is thus damaged at the atomic level. As a result, the efficiency of the component decreases and can even be lost entirely, depending on the damage.

The invention proposes growing a multilayered buffer structure 11 between the growth substrate 10 and the later epitaxial layer sequence 2 to be deposited. Said buffer structure serves to match the different coefficients of thermal expansion to one another and thus to reduce possible strains in the epitaxial layer sequence 2 to be deposited later.

The growth substrate 10 composed of silicon is oriented in the (111) direction in the present case, but other spatial orientations of the growth substrate are also possible. Thus, by way of example, the (100) or the (110) and higher spatial orientations are also suitable. On the substrate 10 there is then applied, inter alia, a multilayered buffer structure 11 composed of AlN and GaN alternately.

This process is illustrated in specific detail in FIG. 9. Beginning on the growth substrate 10, a first layer 11A of the multilayered buffer layer 11 composed of aluminum nitride AlN is deposited. Aluminum nitride is an insulator that nevertheless has a good thermal conductivity. On the first aluminum nitride layer 11A, there are then applied alternately layers composed of gallium nitride 11F to 11I alternately with further layers composed of aluminum nitride 11B to 11D. Gallium nitride grows compressively on aluminum nitride, that is to say that the deposition of gallium nitride onto aluminum nitride leads to a slight strain of the gallium nitride layers. As a result, the individual gallium nitride layers 11F to 11I form sacrificial layers that are slightly strained on account of the different lattice constants of AlN and GaN. The inherent strain compensates for a further thermal strain (expansion or shrinkage) on account of different coefficients of expansion, by virtue of the sacrificial layers taking up the additionally thermally induced strains.

In the present exemplary embodiment, the last layer 11E deposited is once again a layer composed of aluminum nitride. The thickness of the partial layers of the multilayered buffer structure 11 can be different. By way of example, the partial layer 11A composed of aluminum nitride deposited first onto silicon can be significantly thicker than the further partial buffer layers. Besides reducing the thermal expansion during subsequent production process steps, the multilayered buffer structure can also be used to compensate for unevennesses on the surface of the growth substrate 10. This results in a surface that is as uniform as possible for the later process step of epitaxial deposition of the light-emitting layer sequence.

Finally, a highly conductive current spreading layer 12A is applied on the top side of the last partial layer 11E of the multilayered buffer layer. By way of example, this can be a metal or else a thin layer composed of highly doped gallium nitride. Said layer has a low lateral resistance and serves, during subsequent contact-making, to enable current to be divided as uniformly as possible into the partial layers of the layer sequence 12 that are still to be deposited.

After the multilayered buffer layer 11 has been applied, a layer sequence is then deposited, which comprises the active layer suitable for emitting light during operation of the optoelectronic component. A III/V compound semiconductor material can be used for this purpose. In particular, a compound semiconductor based on gallium nitride which is also used for the multilayered buffer layer sequence is suitable for this purpose.

A III/V compound semiconductor material comprises at least one element from the third main group, such as, for example, B, Al, Ga, In, and an element from the fifth main group, such as, for example, N, P, As. In particular, the term "III/V compound semiconductor material" encompasses the group of binary, ternary or quaternary compounds which contain at least one element from the third main group and at least one element from the fifth main group, for example nitride and phosphide compound semiconductors. Such a binary, ternary or quaternary compound can additionally comprise, for example, one or more dopants and additional constituents.

In the present context, "based on nitride compound semiconductor material" means that the semiconductor layer sequence or at least one part thereof, particularly preferably the active zone, comprises or consists of a nitride compound semiconductor material, for example GaN, $Al_nGa_{1-n}N$, $In_nGa_{1-n}N$ or else $Al_nGa_mIn_{1-n-m}N$, where $0 \le n \le 1$, $0 \le m \le 1$ and $n+m \le 1$. In this case, this material need not necessarily have a mathematically exact composition according to the above formula. Rather, it can comprise, for example, one or more dopants and additional constituents. For the sake of simplicity, however, the above formula only comprises the essential constituents of the crystal lattice (Al, Ga, In, N), even if these can be replaced and/or supplemented in part by small amounts of further substances. However, a nitride compound semiconductor material always comprises nitrogen or a nitrogen compound.

It is likewise possible, however, also to use further semiconductor materials. These include, for example, II/VI compound semiconductor materials comprising at least one element from the second main group, such as, for example, De, Mg, Ca, Sr and a material from the sixth main group, for example O, S, Se. In particular, a II/VI compound semiconductor material comprises a binary, ternary or quaternary compound comprising at least one element from the second main group and at least one element from the sixth main group. In addition, such compounds can comprise dopants. The II/VI compound semiconductor materials include, for example, ZnO, ZnMgO, CdS, CnCdS and MgBeO.

In the present exemplary embodiment, the semiconductor layer sequence 2 has an n-doped first partial layer, which is grown on a current spreading layer adjacent to the multilayered buffer layer. A further, then p-doped partial layer is deposited on the n-doped layer. A zone depleted of charge carriers, which is referred to as a pn junction, forms between the two differently doped partial layers. In this zone, the extent of which is substantially dependent on the doping concentration of the two partial layers, charge carrier recombination takes place during operation of the optoelectronic component. In the event of said charge carrier recombination, electromagnetic radiation is emitted in all directions.

In the case of the optoelectronic component proposed, provision is additionally made for the electromagnetic radiation to be coupled out through the buffer layer sequence 11, which is also to be structured later. For this purpose, an additional mirror layer 22 is fitted on the epitaxial layer sequence 2, said mirror layer having a high reflection coefficient. As a result, during operation of the optoelectronic component, electromagnetic radiation in the direction of the mirror layer 22 is reflected from the latter and thus directed in the direction of the buffer layer sequence 11.

The mirror layer 22 is subject to ageing processes caused for example by oxidation, with oxygen, or else by means of moisture. In order to reduce this ageing process as far as possible, the mirror layer 22 is completely surrounded and thus encapsulated by an insulating material 23.

The carrier substrate 15 is then applied to the encapsulation 23 of the mirror layer. FIG. 2 shows a schematic illustration of the optoelectronic component in this process stage.

The growth substrate 10 composed of silicon is subsequently removed. This can be effected by means of an etching method, for example by means of wet-chemical etching. In contrast to mechanical lift-off methods, a chemical method has the advantage that the growth substrate 10 is detached significantly more gently with regard to mechanical loads for the layer sequence 2. In addition, the multilayered buffer layer 11 acts as a natural etching stop layer during an etching method which selectively etches the material of the growth substrate 10.

After the removal of the growth substrate 10 in accordance with FIG. 3, a structuring of the buffer layer 11 in partial regions 17 is then performed. Various methods can be used for this. By way of example, the buffer layer can be randomly structured by being partly etched. Alternatively, it is also possible to provide periodic structures in the form of pyramids, hills or the like of the buffer layer 11 in the partial regions 17. The etching leads to a non-planar surface, whereby the coupling-out of light is facilitated.

Given a total thickness of the buffer layer of 1 µm to 5 µm (typically 2 µm to 4 µm) and a thickness of the epitaxially grown layer sequence of 1 µm to 7 µm overall (typically 4 µm to 6 µm) the buffer layer 11 can be roughened in a targeted or untargeted manner in the partial regions 17. By way of example, 1 µm high pyramids can be produced by selective removal of the multilayered buffer layer. These pyramids and the roughening in the buffer layer 11 serve for coupling out light during subsequent operation of the optoelectronic component. In other words, when the growth substrate 10 is detached, the buffer layer 11 is not removed, but rather left on the layer sequence as a light coupling-out layer. This saves process steps in the production method and also the formation of an additional light coupling-out layer on the top side of the epitaxially grown layer sequence 2.

The roughening is illustrated to an exaggerated extent in the exemplary embodiment in accordance with FIG. 3. It is nevertheless possible to remove the buffer layer in partial regions and additionally also to structure parts of the epitaxially grown layer sequence 2 underneath.

Alongside structured partial regions 17, additional partial regions 11' of the multilayered buffer layer sequence are provided, in which contact elements are formed later. For this purpose, in accordance with FIG. 4, the partial regions 11' of the multilayered buffer sequence are etched in order to form a trench. The latter passes completely through the multilayered buffer layer sequence 11 and thus makes contact with the underlying partial layers of the epitaxial layer sequence 2'. Afterward, the trench is filled with a material and a contact pad 18 is formed. The contact pad 18 makes electrical contact with the epitaxial layer sequence 2 by virtue of completely severing the multilayered buffer layer sequence 11' having poor electrical conductivity. In the exemplary embodiment in FIG. 4, the contact pad makes contact with the highly doped gallium nitride layer that serves as the current spreading layer of the layer sequence 2' and is illustrated as layer 12A in FIG. 9.

FIG. 5 shows a further embodiment of a production process for an optoelectronic component according to the principle proposed.

In the case thereof, a silicon wafer is likewise used as a growth substrate 10. A multilayered buffer layer sequence 11 is deposited on said wafer in order to compensate for a different thermal expansion behavior of the growth substrate 10 and of the later partial layers 12 to 14 of the epitaxial layer sequence 2. The epitaxial layer sequence 2 comprises, in a simplified illustration, an n-doped first partial layer 12, for example composed of n-doped gallium nitride, and a p-doped second partial layer 14. The pn junction 13 forms between the two partial layers 12 and 14.

In the exemplary embodiment, the optoelectronic component is realized by means of an individual layer sequence. Alongside an individual pn junction, however, a plurality of pn junctions arranged one above another are also possible. In addition, it is possible to use different materials for the production of individual pn junctions in order thus to generate light having different wavelengths. In addition, the individual partial layers 12 and 14 can comprise further current spreading and charge carrier transport or blocking layers.

After the epitaxial deposition of the layer sequence 2, in accordance with FIG. 6, a multiplicity of holes 50 are introduced into the epitaxially grown layer sequence 2. Said holes extend, as illustrated, through the partial layers 14 and 13 and end in the n-doped first partial layer 12. They serve for making electrical contact with the partial layer 12.

For this purpose, their sidewalls are provided with an insulating material 52 in order to prevent a short circuit into the partial layers 14 and 13, respectively. The resulting insulated holes are subsequently filled with an electrically conductive material 45. A first contact layer 60 is applied on the surface in order to make contact with the partial layer 14. The first contact layer 60 can comprise a specularly reflective material and thus simultaneously serve as a reflection layer. Alternatively, it can be formed with a transparent conductive oxide, for example ITO.

An insulation 53 on the underside of the first contact layer 60 prevents a short circuit between the electrically conductive material 45 and the first contact layer 60. A second contact layer 40 is applied to the insulation layer 53, said second contact layer 40 being electrically conductively connected to the material 45 in the holes 50. Consequently, a second contact layer 40 is formed, which can be led below the optoelectronic component toward the outside to corresponding contact elements. If the first contact layer 60 is formed with a transparent conductive oxide, the second contact layer 40 can be formed with a specularly reflective material.

Afterward, the carrier substrate 15 is applied to the second contact layer 40 and the growth substrate 10 is removed wet-chemically. A roughening of the buffer layer 11 improves the coupling-out of light from the optoelectronic component and the layer sequence 2. Finally, in a partial region, the epitaxial layer sequence 2 is removed and a contact pad 61 is provided, which makes contact with the first contact layer 60. A second contact pad for making contact with the second contact layer 40 is not illustrated, for reasons of clarity.

An alternative embodiment is shown in FIG. 7. After the production of the epitaxial layer sequence 2, the first contact layer 60 is deposited areally on the last partial layer 14. Afterward, large-area structures having a plurality of holes 50 are provided in the contact layer 60. Said holes reach through the first contact layer 60 and also the two partial layers 14 and 13 and end in the partial layer 12 or in a current spreading layer of the partial layer 12 of the layer sequence 2. Sidewalls 52 of the holes 50 are once again provided with an insulation material. In addition, a further insulation layer 53 is applied in the regions between the individual holes 50. Afterward, the holes are filled with an electrically conductive material 45 and a further second contact layer 65 is formed. The latter makes contact with the electrically conductive material 45 and is arranged on the electrical insulation layer 53.

The second contact layer 65 is led toward the outside in order to form a corresponding contact pad. A further insulation layer 54 is applied to the second contact layer 65 and to the first contact layer 60. Said further insulation layer serves for compensation of corresponding height differences and for planarization of the optoelectronic component. Afterward, the carrier substrate 15 is fixed to the second insulation layer 54 and the growth substrate 10 is removed. The embodiment illustrated in FIG. 7 arises after roughening and structuring of the multilayered buffer layer sequence 11. The first contact layer 60 is led toward the outside electrically via a further contact pad and makes contact with the p-doped partial layer 14. The second contact layer 65, via the material 45 in the holes 50, makes contact with the first partial layer 12 of the epitaxially grown layer sequence 2.

In the two embodiments according to FIG. 6 and FIG. 7, the contact pads are arranged on the same side as the optoelectronic component. An alternative embodiment with rear-side contacts is shown in FIG. 8. In this embodiment, a first contact layer 60' is deposited areally on the epitaxial layer sequence 2. Said contact layer 60' is perforated in partial regions, such that holes 50 are formed in said partial regions, said holes extending through the partial layers 14 and 13 of the layer sequence 2 and ending in the partial layer 12. The sidewalls of said holes are once again provided with an insulating material 52. In addition, insulating material 53 is provided on the partial regions 60' adjacent to the holes 50. A short circuit between the second contact layer 65 and the first contact layer 60' is thus prevented. The first contact layer 60' can once again be embodied in a reflective fashion.

Afterward, the first and second contact layers 60' and 65 are planarized, for example by chemical/mechanical polishing. The insulating carrier substrate 15 is then applied on the planarized surface. In the carrier substrate 15, in further steps a plurality of holes 62' and 65' are arranged, which are subsequently filled with electrically conductive material 62 and 66, respectively. These therefore form rear contacts for making contact with the contact layers 60' and 65. Afterward, the growth substrate composed of silicon is once again removed by means of chemical methods, without the multilayered buffer layer 11 being concomitantly removed. In a last step, the multilayered buffer layer 11 can be structured and/or roughened in order to improve the coupling-out of light from the optoelectronic component.

The combination of the epitaxial layer sequence 2 grown on a silicon substrate with the through-plating through the reflective first contact layer 60' achieves, firstly, good coupling-out of light through the multilayered buffer layer sequence still present, in conjunction with good ohmic connection. By virtue of this concept, the poorly conductive buffer structure 11 does not have to be severed. Rather, the individual partial layers of the epitaxial layer sequence can be electrically connected directly on the rear side or via contact holes. This results in a low forward voltage in conjunction with good coupling-out of light and current spreading in the individual partial layers.

The multilayered buffer layer sequence 11 thus serves, during the production process, to reduce thermal strains which can lead to damage to the layer sequence 2 during the production process. At the same time, however, it is not removed during the so-called "rebonding process", but rather remains on the surface of the first partial layer 12 of the epitaxially grown layer sequence 2.

The production method proposed enables industrial-scale production of optoelectronic components for various fields of application wherein even processes that are difficult to control, in particular the production of gallium nitride and other III-V compound semiconductors on silicon growth substrates, are possible.

The invention claimed is:

1. A method for producing an optoelectronic component, the method comprising:
    providing a silicon-based growth substrate having a first coefficient of thermal expansion;
    applying a multilayered nitride-containing buffer layer sequence;
    epitaxially depositing a layer sequence, the layer sequence having a second coefficient of thermal expansion, that differs from the first coefficient of thermal expansion, and that further comprises an active layer suitable for emitting electromagnetic radiation;
    forming contacts in the epitaxially deposited layer sequence;
    forming a mirror layer on that side of the layer sequence that is remote from the multilayered nitride-containing buffer layer sequence;
    forming an insulating material on the mirror layer, the mirror layer being completely surrounded by said insulating material;
    applying a carrier substrate on the epitaxially deposited layer sequence provided with contacts;
    removing the growth substrate;
    structuring the multilayered buffer layer sequence in order to increase a coupling-out of electromagnetic radiation; and
    making contact with the epitaxially deposited layer sequence.

2. The method as claimed in claim 1, wherein the multilayered buffer layer sequence comprises a first partial buffer layer and at least one second partial buffer layer and is embodied for reducing thermal strains induced by the production process on account of the different first and second coefficients of thermal expansion.

3. The method as claimed in claim 1, wherein the growth substrate is etched for the purpose of being removed and the multilayered buffer layer sequence serves as an etching stop.

4. The method as claimed in claim 1, wherein the layer sequence comprises a first doped partial layer and a second, differently doped partial layer deposited thereon, wherein a boundary region of the two partial layers forms the active layer and charge carrier recombination takes place in an operating mode of the component.

5. The method as claimed in claim 1, wherein the layer sequence comprises at least one current spreading layer.

6. The method as claimed in claim 5, wherein the current spreading layer is formed between the multilayered nitride-containing buffer layer sequence and further partial layers of the epitaxial layer sequence.

7. The method as claimed in claim 1, wherein the mirror layer forms a current spreading layer.

8. The method as claimed in claim 1, wherein a partial buffer layer of the multilayered nitride-containing buffer layer sequence comprises the same material, in particular GaN, as a partial layer of the epitaxially grown layer sequence.

9. The method as claimed in claim 1, further comprising structuring, in particular by etching a surface of the multilayered buffer layer sequence in order to produce a light coupling-out layer.

10. The method as claimed in claim 1, wherein making contact comprises:
    forming at least one hole with an opening on that side of the layer sequence which is remote from the multilayered buffer layer sequence;
    forming an insulation layer on sidewalls of the at least one hole;
    filling the at least one hole with a conductive material, such that an electrical contact with the layer sequence is produced in at least in a bottom region of the at least one hole; and
    forming a bonding contact electrically connected to the conductive material.

11. The method as claimed in claim 1, wherein making contact comprises:
- forming at least one through-hole in the carrier substrate with an opening wherein sidewalls of the through-hole are provided with an insulating material; and
- filling the at least one through-hole with an electrically conductive material for making contact with the layer sequence.

12. The method as claimed in claim 1, wherein the growth substrate substantially comprises silicon, and wherein the growth substrate has at least one spatial orientation selected from the group consisting of:
- a (111) orientation,
- a (100) orientation,
- a (110) orientation,
- a (kk0) orientation and
- a (k00) orientation,
- where k is an integer greater than 1.

13. The method as claimed in claim 1, wherein during operation of the optoelectronic component, electromagnetic radiation in the direction of the mirror layer is reflected from the mirror layer and directed in the direction of the buffer layer sequence.

14. The method as claimed in claim 1, wherein the mirror layer is completely encapsulated by the layer sequence and the insulating material.

15. The method as claimed in claim 14, wherein the mirror layer directly adjoins to the layer sequence and the insulating material.

16. The method as claimed in claim 1, wherein the layer sequence includes an n-doped first partial layer and a p-doped second partial layer.

17. The method as claimed in claim 16, wherein the second partial layer is arranged between the first partial layer and the carrier substrate.

\* \* \* \* \*